United States Patent [19]
Wiener et al.

[11] Patent Number: 5,276,605
[45] Date of Patent: Jan. 4, 1994

[54] NEGATIVE HALF-WAVE SUMMING RECTIFIER APPARATUS FOR A THREE PHASE AC VOLTAGE

[75] Inventors: Clifford J. Wiener, Franklin Square, N.Y.; Samuel Hsieh, Marlboro, N.J.; George C. Pusey, III, Jackson, N.J.; Paul A. Verdi, Stanhope, N.J.

[73] Assignee: AlliedSignal Inc., Morris Township, Morris County, N.J.

[21] Appl. No.: 33,479

[22] Filed: Mar. 18, 1993

[51] Int. Cl.$^5$ .................. H02M 7/217; G01R 19/00; H02B 1/20
[52] U.S. Cl. .................... 363/127; 324/107; 361/91
[58] Field of Search .............. 363/125, 127, 178; 324/107, 119, 123; 361/91

[56] References Cited

U.S. PATENT DOCUMENTS

| | | | |
|---|---|---|---|
| 4,127,888 | 11/1978 | Epstein | 361/91 |
| 4,333,119 | 6/1982 | Schoenmeyr | 361/91 |
| 4,885,532 | 12/1989 | Macey | 324/133 |
| 4,941,080 | 7/1990 | Sieborger | 363/127 |
| 5,091,839 | 2/1992 | Gaul et al. | 363/41 |

Primary Examiner—Emanuel T. Voeltz
Assistant Examiner—Matthew Nguyen
Attorney, Agent, or Firm—Howard G. Massung

[57] ABSTRACT

The phase voltages of a three phase alternating current input voltage are converted into currents. The negative half-cycles of the currents are added and the polarity of the added current is reversed. The current at the reversed (positive) polarity is converted into a positive output voltage which is a measurement of the input voltage.

16 Claims, 2 Drawing Sheets

NEGATIVE HALF-WAVE SUMMING RECTIFIER APPARATUS FOR A THREE PHASE AC VOLTAGE

BACKGROUND OF THE INVENTION

This invention relates to apparatus for measuring a three phase alternating current input voltage by converting the phase voltages into currents, adding the negative half-wave currents, reversing the polarity of the added current to provide a positive current and converting the positive current into a positive output voltage which is a measurement of the input voltage.

It is often necessary to measure a three phase alternating current input voltage to insure, for example, that the amplitude of the input voltage is within desired limits. The measurement can be achieved by using full or half-wave summing rectifier apparatus.

Full wave summing rectifier apparatus tends to be complex in construction.

Negative half-wave summing rectifier apparatus according to the invention has distinct advantages in that it features a minimum number of components, is powered by a single, positive power supply and permits the use of external resistors. The apparatus of the invention is thus simple in construction and is effective for the purpose described since the inputs to the apparatus are at zero volts for a small percentage of the time and there are no errors during the positive half cycles of the input voltages, as will be discerned from the description of the invention which follows.

SUMMARY OF THE INVENTION

This invention relates to a negative half-wave summing rectifier apparatus for a three phase AC input voltage ($V_{in}$), wherein input resistors ($R_a$, $R_b$ and $R_c$) are provided for each of the three phases (a, b, and c) of the input voltage for converting the phase voltages ($V_a$, $V_b$ and $V_c$) into currents. The level of the input voltage along with resistors $R_a$, $R_b$ and $R_c$ sets the current through three transistors. Transistors are provided which are diode connected, clamping the input voltage to a predetermined maximum positive value. The arrangement is such that negative half-wave currents at the collectors of the three transistors are added and the added current is reversed in polarity (negative to positive) by a current mirror transistor arrangement. The positive added current is converted into a positive output voltage ($V_o$) via a gain resistor ($R_G$). The output voltage is a measurement of the input voltage. The output voltage equation is:

$$V_O = -(V_a/R_a + V_b/R_b + V_c/R_c)(R_g),$$

for $V_a$, $V_b$ and $V_c$ being negative.

DETAILED DESCRIPTION OF THE INVENTION

Figure 1:
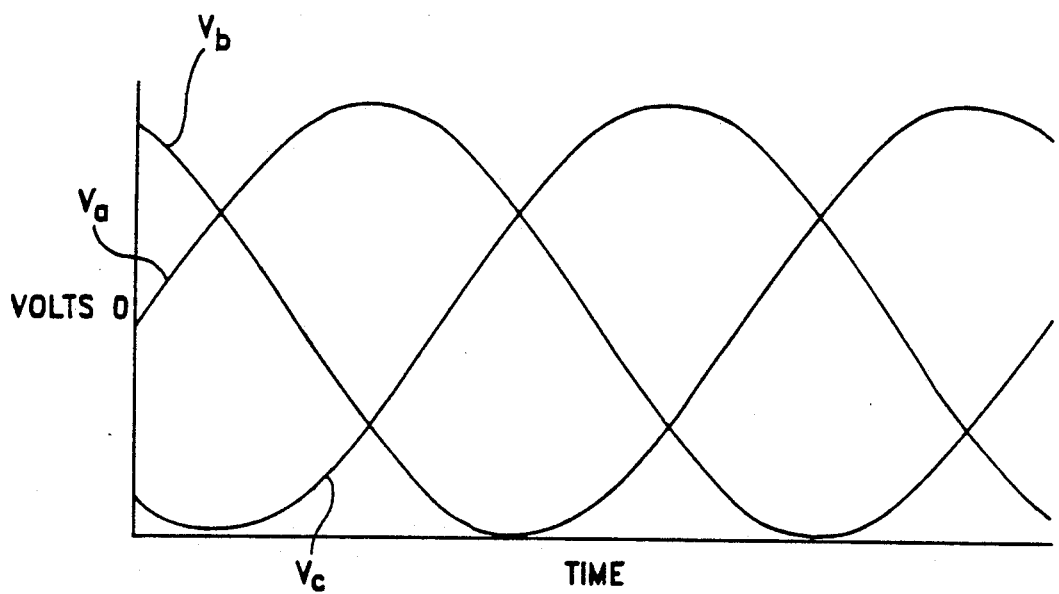
FIG. 1 is a graphical representation illustrating the waveforms of the three input phase voltages ($V_a$, $V_b$ and $V_c$).
Figure 3:
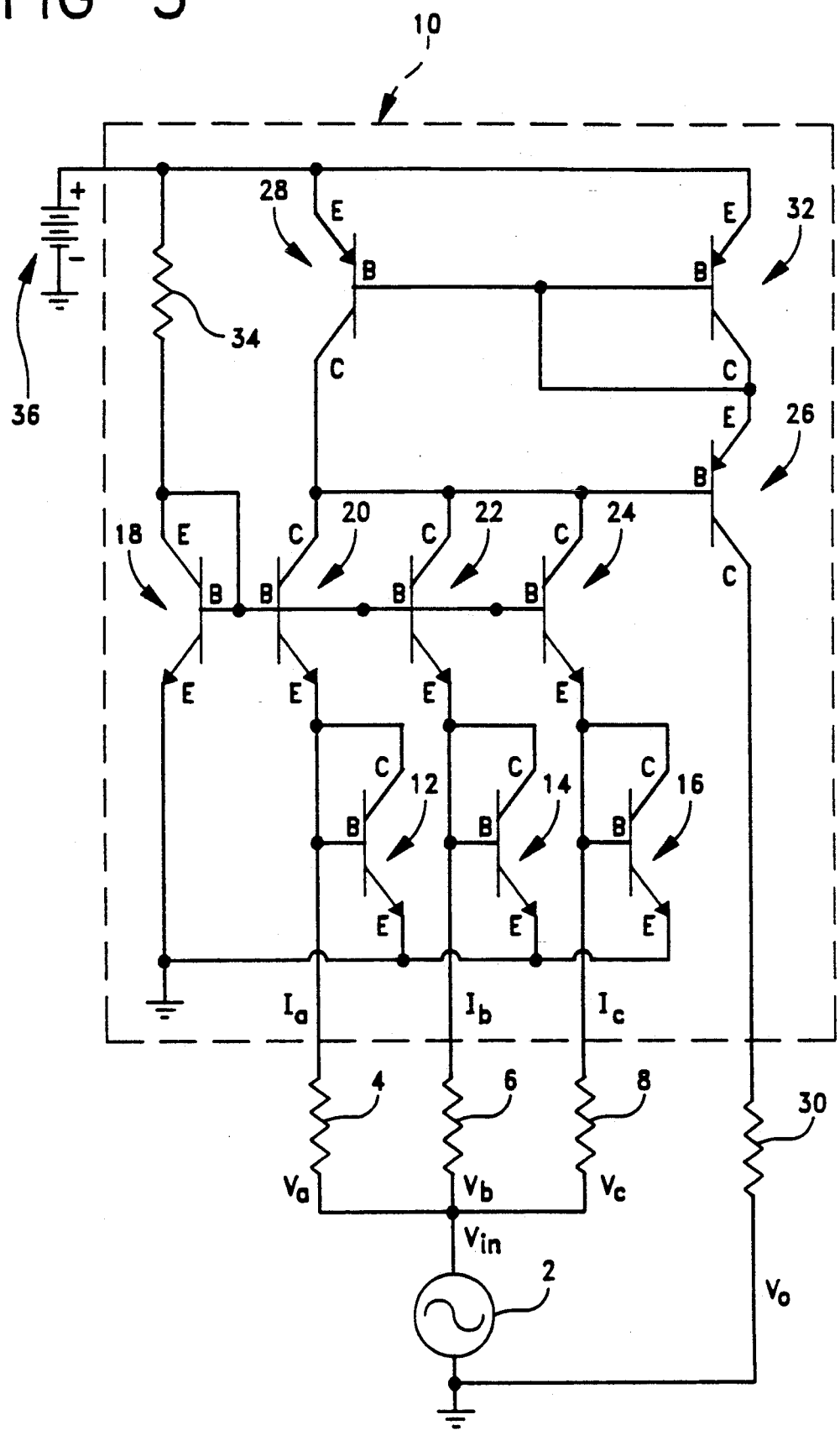
FIG. 3 is an electrical schematic diagram of the apparatus of the invention.

With reference first to FIG. 3, an alternating current (AC) voltage source is designated by the numeral 2. Voltage source 2 provides a three phase input voltage $V_{in}$, with the phase voltages being designated as $V_a$, $V_b$ and $V_c$. The three phase voltages are 120 degrees apart. That is to say, if $V_a$ is taken as having a phase angle of 0 degrees, $V_b$ has a phase angle of 120 degrees and $V_c$ has a phase angle of 240 degrees. The waveforms of the phase voltages $V_a$, $V_b$ and $V_c$ are shown in FIG. 1.

$V_a$ is applied through a resistor 4 to provide a current $I_a$, $V_b$ is applied through a resistor 6 to provide a current $I_b$ and $V_c$ is applied through a resistor 8 to provide a current $I_c$. Currents $I_a$, $I_b$ and $I_c$ are applied to a summing rectifier circuit which is designated by the numeral 10. Resistors 4, 6 and 8 are external circuit 10 which includes NPN transistors 12, 14 and 16. The emitters of transistors 12, 14 and 16 are at approximately zero volts.

In the arrangement described transistors 12, 14 and 16 are used as, for example, 0.7 volt positive clamps.

The collector C of transistor 12 is connected to the emitter E of an NPN transistor 20, the collector C of transistor 14 is connected to the emitter E of an NPN transistor 22 and the collector C of transistor 16 is connected to the emitter E of an NPN transistor 24.

The collectors C of transistors 20, 22 and 24 are connected to the base B of a PNP transistor 26 and are connected to the collector C of a PNP transistor 28.

Collector C of transistor 26 is connected to ground via a gain resistor 30 which, like resistors 4, 6 and 8, is external circuit 10. Emitter E of transistor 26 is connected to the collector C of a PNP transistor 32 and is connected between bases B of transistors 28 and 32.

Base B of transistor 24 is connected to base B of transistor 22, base B of transistor 22 is connected to base B of transistor 20 and base B of transistor 20 is connected to base B of transistor 18. Collector C of transistor 18 is connected between base B of transistor 20 and base B of transistor 18 and is connected through a resistor 34 to a source of positive DC voltage such as a battery 36. Emitters E of transistors 28 and 32 are connected to DC voltage source 36.

Figure 2:
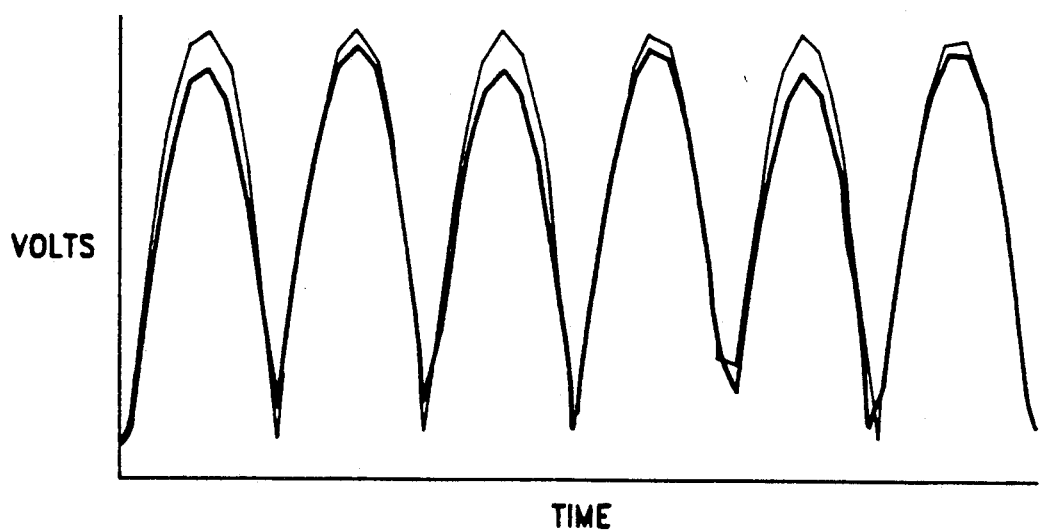
FIG. 2 is a graphical representation illustrating the waveform of the output voltage ($V_o$).

Voltage $V_{in}$ from three-phase AC voltage source 2 may be, for purposes of illustration, a 400 Hz, 2 volt peak to peak AC voltage. Phase voltages $V_a$, $V_b$ and $V_c$ in cooperation with resistors 4, 6 and 8, respectively, set the negative currents through transistors 20, 22 and 24. The current is applied through the PNP current mirror formed by transistors 26, 28 and 32 where it is reversed in polarity (negative to positive). The output current through transistor 26 is converted to a positive output voltage $V_o$, by resistor 30 and which output voltage represents the summed rectified negative half-waves of the input voltage, and, as such, is a measurement of input voltage $V_{in}$. The output voltage has a waveform as illustrated in FIG. 2.

It is emphasized that resistors 4, 6, 8 and 30 are external circuit 10 as aforenoted, which is important when circuit 10 is in the form of a chip, as will be appreciated by those skilled in the art.

The arrangement described thus uses input resistors 4, 6 and 8 external circuit 10 to convert input phase voltages into currents. The emitters (E) of transistors 20, 22 and 24 are at approximately zero volts as established by transistor 18. The circuit adds the negative currents at the collectors (C) of transistors 20, 22 and 24, reverses the polarity of the added current via the current mirror formed by transistors 26, 28 and 32 and converts the current into a positive output voltage ($V_o$)

via resistor 30 also external circuit 10. The output voltage equation is:

$$V_O = -(V_a/R_a + V_b/R_b + V_c/R_c)(R_g),$$

for $V_a$, $V_b$ and $V_c$ being negative.

Because the current seen by transistor 18 is not equal to the current seen by transistors 26, 28 and 32, the voltages at the emitters (E) of transistors 26, 28 and 32 are not equal to zero volts and this is the main source of error, especially when the input voltages are at zero volts. Although this error can be corrected with appropriate feedback means, the apparatus of the invention accomplishes the desired result in a simple and less complex fashion. Thus, a minimum number of transistors are required, as is a single power supply 36. Further, the use of resistors external circuit 10 is made possible by the illustrated and described configuration.

It will be appreciated that the arrangement described works well as a three phase negative half-wave summing rectifier because the inputs are at zero volts for a small percentage of the time. There is no error during the positive half-cycles of the input voltages, since the transistors are cut-off and any offset voltages are in accordance with the value of input resistors 4, 6 and 8. To reduce the offset voltages, the input resistors can be selected so that the average input current is the current seen by transistor 18.

There has thus been described apparatus which converts the phase voltages of a three phase input voltage into negative half-wave currents. The negative half-wave currents are added and the polarity of the added current is reversed. The reversed polarity (positive) current is converted into a positive output voltage which is a measurement of the input voltage. The apparatus is advantageous over prior art circuits for the purposes described in that it is simple and achieves the desired result with a lower component count than has otherwise been possible.

With the above description of the invention in mind, reference is made to the claims appended hereto for a definition of the scope of the invention.

What is claimed is:

1. Negative half-wave summing rectifier apparatus for a three phase AC input voltage, comprising:
   first, second and third resistors, each of which is connected to a phase of a three phase AC input voltage source for converting the respective phase voltages into phase currents;
   over-voltage protection means connected to the first, second and third resistors;
   adding means connected to the over-voltage protection means for adding the negative half-cycles of the phase currents to provide a negative added current;
   converting means connected to the adding means for converting the negative added current to a positive current; and
   a fourth resistor connected to the converting means for converting the positive current to a positive output voltage which is a measurement of the input voltage.

2. Apparatus as described by claim 1, wherein the over-voltage protection means includes:
   a first NPN transistor having a base connected to the first resistor and an emitter connected to ground;
   a second NPN transistor having a base connected to the second resistor and on emitter connected to ground; and
   a third NPN transistor having a base connected to the third resistor and on emitter connected to ground.

3. Apparatus as described by claim 2, wherein the adding means includes:
   a fourth NPN transistor having an emitter connected to a collector of the first NPN transistor;
   a fifth NPN transistor having an emitter connected to a collector of the second NPN transistor;
   a sixth NPN transistor having an emitter connected to a collector of the third NPN transistor;
   a base of the sixth NPN transistor connected to a base of the fifth NPN transistor and the base of the fifth NPN transistor connected to a base of the fourth NPN transistor;
   a seventh NPN transistor having a base connected to the base of the fourth NPN transistor, an emitter connected to ground and a collector connected to a source of positive DC voltage; and
   the emitter of the fourth, fifth and sixth transistors being at a voltage established by the seventh transistor.

4. Apparatus as described by claim 3, wherein:
   the voltage established by the seventh transistor is approximately zero volts.

5. Apparatus as described by claim 4, wherein:
   the base of the fourth NPN transistor is connected to the collector of the seventh NP transistor.

6. Apparatus as described by claim 5, wherein the converting means includes:
   a first PNP transistor having a collector connected to a collector of the fourth NPN transistor and an emitter connected to the source of positive DC voltage;
   a second PNP transistor having an emitter connected to the source of positive DC voltage and a base connected to a base of the first PNP transistor;
   a third PNP transistor having an emitter connected between the bases of the first and second PNP transistors connected to a collector of the second PNP transistor, and a base connected to the collectors of the fourth, fifth and sixth NPN transistors.

7. Apparatus as described by claim 6, wherein:
   the fourth resistor connected to the converting means for converting the positive current to a positive output voltage is connected to a collector of the third PNP transistor.

8. Negative half-wave summing apparatus for a three phase AC input voltage comprising:
   first, second and third resistors, each of which is connected to a phase of a three phase AC input voltage source for converting the respective phase-voltages into phase-currents;
   a circuit including over-voltage protection means connected to the first, second and third resistors, adding means connected to the over-voltage protection means for adding the negative half-cycles of the phase currents to provide a negative added current, and converting means connected to the adding means for converting the negative added current to a positive current; and
   a fourth resistor connected to the converting means for converting the positive current to a positive output voltage which is a measurement of the input voltage.

9. Apparatus as described by claim 8, wherein the over-voltage protection means includes:
- a first NPN transistor having a base connected to the first resistor and an emitter connected to ground;
- a second NPN transistor having a base connected to the second resistor and on emitter connected to ground; and
- a third NPN transistor having a base connected to the third resistor and on emitter connected to ground.

10. Apparatus as described by claim 9, wherein the adding means includes:
- a fourth NPN transistor having an emitter connected to a collector of the first NPN transistor;
- a fifth NPN transistor having an emitter connected to a collector of the second NPN transistor;
- a sixth NPN transistor having an emitter connected to a collector of the third NPN transistor;
- a base of the sixth NPN transistor connected to a base of the fifth NPN transistor and the base of the fifth NPN transistor connected to a base of the fourth NPN transistor;
- a seventh NPN transistor having a base connected to the base of the fourth NPN transistor, an emitter connected to ground and a collector connected to a source of positive DC voltage; and
- the emitter of the fourth, fifth and sixth transistors being at a voltage established by the seventh transistor.

11. Apparatus as described by claim 10, wherein:
the voltage established by the seventh transistor is approximately zero volts.

12. Apparatus as described by claim 11, wherein:
the base of the fourth NPN transistor is connected to the collector of the seventh NPN transistor.

13. Apparatus as described by claim 12, wherein the converting means includes:
- a first PNP transistor having a collector connected to a collector of the fourth NPN transistor and an emitter connected to the source of positive DC voltage;
- a second PNP transistor having an emitter connected to the source of positive DC voltage and a base connected to a base of the first PNP transistor;
- a third PNP transistor having an emitter connected between the bases of the first and second PNP transistors connected to a collector of the second PNP transistor, and a base connected to the collectors of the fourth, fifth and sixth NPN transistors.

14. Apparatus as described by claim 13, wherein:
the fourth resistor connected to the converting means for converting the positive current to a positive output voltage is connected to a collector of the third PNP transistor.

15. A method for providing an output voltage which is a measurement of a three phase AC input voltage, comprising:
- converting each of the phase voltages of the three phase AC voltage into phase currents;
- adding the negative half-cycles of the phase currents for providing a negative added current;
- converting the negative added current to a positive current; and
- converting the positive current to a positive output voltage which is a measurement of the three-phase input voltage.

16. A method as described by claim 15, including:
protecting the phase currents from an over-voltage condition.

* * * * *